United States Patent [19]

Kamanou et al.

[11] Patent Number: 5,124,992
[45] Date of Patent: Jun. 23, 1992

[54] ERROR CORRECTING ENCODER/DECODER FOR A DIGITAL TRANSMISSION INSTALLATION

[75] Inventors: Pierre-Francois Kamanou, Aubervilliers; Christophe Caquot, Courbevoie, both of France

[73] Assignee: Alcatel Transmission Par Faisceaux Hertiziens, Cedex, France

[21] Appl. No.: 484,758

[22] Filed: Feb. 26, 1990

[30] Foreign Application Priority Data

Feb. 24, 1989 [FR] France ................................. 89 02407

[51] Int. Cl.[5] ............................................. G06F 11/10
[52] U.S. Cl. ..................................... 371/37.1; 371/37.6
[58] Field of Search .................... 371/37.1, 37.6, 38.1, 371/39.1, 43, 44, 45

[56] References Cited

U.S. PATENT DOCUMENTS

| | | | |
|---|---|---|---|
| 3,593,282 | 7/1971 | Tong | 371/44 |
| 3,842,400 | 10/1974 | Liefeld et al. | |
| 5,022,031 | 6/1991 | Baggen | 371/43 |

OTHER PUBLICATIONS

IEE Proceedings F. Communications, Radar & Signal, vol. 132, No. 2, Apr. 1985, Stevenage GB, pp. 77–83; I. S. Reed & T. K. Truong: "Error–Treillis Syndrome Decoding Techniques for Convolutional Codes".
IEEE Transactions on Information Theory, vol. IT-9, Jul. 1963, New York USA, pp. 143–156; A. D. Syner & R. B. Ash: "Analysis of Recurrent Codes".
IEEE Transactions on Computers, vol. C-35, No. 9, Sep. 1986, New York, USA, pp. 781–789; I. S. Reed et al.: "The VLSI Design of an Error Trellis Syndrome Decoder for Certain Convolutional Codes".
IEEE Journal of Selected Areas in Communction, vol. 6, No. 3, Apr. 1988, New York, USA, pp. 547–557; D. Haccoun et al.: "New Architechtures For Fast Convolutional Encoders and Threshold Decoders."

Primary Examiner—Robert W. Beausoliel
Attorney, Agent, or Firm—Sughrue, Mion, Zinn, Macpeak & Seas

[57] ABSTRACT

An encoder and decoder for use with a Wyner-Ash code whose memory order m is not less than six. Both the encoder and decoder operate in series by means of six shift registers connected in series, thereby making it possible to calculate a check bit on encoding in parallel by means of respective exclusive OR circuits, and consequently also making it possible to calculate a syndrome bit on decoding by a complementary exclusive OR circuit. Successive syndrome bits specify the position of an error in a received message, and the error is then corrected in the last shift register of the decoder.

6 Claims, 4 Drawing Sheets

ERROR CORRECTING ENCODER/DECODER FOR A DIGITAL TRANSMISSION INSTALLATION

BACKGROUND OF THE INVENTION

The present invention relates to an error correcting encoder/decoder for an installation using digital transmission, in particular by radio beam.

The purpose of using error correcting encoding in the digital radio beams used for civilian transmission is to correct isolated errors that come, for example, from the ignition systems of motor vehicles.

In order to reduce inter-channel disturbances as much as possible, the increase in data rate due to the error-correcting encoding should not exceed about 3% of the initial data rate due to multiplexing the main data flow with additional operating and maintenance information and with other data streams, if any. It is only under this condition that the filter characteristics of the transmission system in equipment existing prior to the introduction of the encoding can be conserved: it is then possible to change from a non-coded version to an encoded version of the equipment merely by swapping the frame-cards, only. In such applications it is therefore appropriate to select from the numerous error correcting codes that exist in the literature an error correcting code which is simple and has a low redundancy rate.

In addition, in this type of application, it is advantageous to use an error correcting code which is ipso facto transparent to phase ambiguity (which is manifested, as is known, by the fact that the twos complement of a code word also belongs to the code).

Finally, it is advantageous for the selected error correcting code to be capable of being applied to all radio beams, regardless of the type of modulation used: having 4, 16, 64 or even 256 phase states.

All of these constraints have lead the inventors to select the Wyner-Ash code from amongst the error correcting codes which exist in the literature.

This code is as described, for example, in the work of the Russian author Alexandru Spataru "Fondements de la théorie de la transmission de l'information" (Fundamentals of information transmission theory), published in France by Presses Polytechniques Romandes, 1987, pp. 132–136.

It is a systematic convolutional code which enables one error, and one error only, to be corrected in the entire constraint length, regardless of the position the error occupies in a block.

Its three parameters, namely: k (number of information bits input to the encoder); n (number of output bits from the encoder); and m (order of the delay memory included in the encoder), are defined by the following equations:

$$k = 2p - 1$$

$$n = k + 1$$

$$m = p + 1$$

where p is an integer.

In the case under consideration, it is explained above that the redundancy rate of the code should not be significantly greater than 3%, thereby limiting suitable values for the number p. Calculation shows that under these conditions it is necessary to select an integer p which is not less than 5. In particular, if p is selected to be equal to 5, then a code is obtained for which $k = 31$ and $n = 32$, thereby giving an acceptable redundancy rate of 3.2%.

This code is such that the check bit Yi of an n-bit block leaving the encoder at instant i is calculated as a function of the k other bits in the same block at said instant i (Xi,1; Xi,2; Xi,3; ...; Xi,k), as a function of the same k other bits at the instant $i = 1$ (Xi−1,1; Xi−1,2; ..., Xi−1,k), etc. ..., and finally as a function of the same k other bits at the instant $i - m$ (Xi−m,1; ...; Xi−m,k), by performing modulo-2 addition of all of the k other bits present at the instants: i, i−1, ..., i−m; and each weighted by a respective coefficient A which is equal to 0 or to 1, and which is defined by the code generator matrix.

For greater clarity, this method of calculating the check bit Yi is shown diagrammatically in accompanying FIG. 1. In this diagram, the k bits (Xi,1; Xi,2; ..., Xi,k) entering the encoder at instant i are placed on the left of the figure whereas the (k+1) bits (Xi,1; Xi,2; ...; Xi,k; Yi) leaving it at the same instant i are on the right of the figure.

The check bit Yi is the output from a binary adder S1 which itself receives the k input bits, each weighted by a respective coefficient A1,1; A1,2; ..., A1,k, each of which is equal to 1, and which also receives the output from a counting bistable B2.

The counting bistable B2 itself receives the output from another binary summing circuit S2. The inputs of this summing circuit S2 are themselves constituted firstly by the k input bits, each weighted by a respective coefficient A2,1; A2,2; ...; A2,k equal to 0 or to 1 and defined by the code generator matrix, and secondly the output from another counting bistable B3, and so on to the "modulo-2" adder Sm whose output is applied to counting bistable Bm, and whose input receives only the k predefined input bits, each weighted by a respective coefficient Am,1; Am,2; ...; Am,k, where each coefficient is equal to 0 or 1 and is defined by the code generator matrix, which matrix is thus as follows:

| R1 = A1,1 | A1,2 ... A1,k |
|---|---|
| R2 = A2,1 | A2,2 ... A2,k |
| . | . |
| . | . |
| Rm = Am,1 | Am,2 ... Am,k | it being understood that the coefficients in the first row R1 of the matrix (A1,1 to A1,k) are all equal to 1.

In order to apply this encoding principle directly to digital transmissions by radio beam, it would be necessary to provide serial-to-parallel conversion upstream from the encoder and parallel-to-serial conversion downstream from the encoder, since the Wyner-Ash encoder is a priori a parallel encoder, as can clearly be seen from FIG. 1. This would suffer from the drawback of complicated and expensive physical implementation.

The invention seeks to remedy this drawback.

SUMMARY OF THE INVENTION

To this end the present invention provides an error correcting encoder/decoder system for an installation for digital transmission, in particular by means of a radio beam, the system using a Wyner-Ash error correcting code for which the above-defined integer p is not less than 5 (giving m not less than 6). The encoder in the system uses m shift registers in series, with at least the p first shift registers each including n bistables, the outputs from the k first bistables of the first of these shift registers being connected to a first exclusive OR circuit, the outputs of the k first bistables of the second shift register being connected to a second exclusive OR circuit if they correspond to a one value coefficient of the second row of the code to generator matrix, and being unconnected when they correspond to a zero value coefficient, and so on up to the n-th shift register which is itself associated in the same way with an m-th exclusive OR circuit, with the m outputs of these m exclusive OR circuits being connected to another exclusive OR circuit whose output is applied to one of the two inputs to an input multiplexer to the encoder, the other input of the multiplexer receiving successive sequences each constituted by k information bits, followed by a gap suitable for receiving a check bit, the multiplexer having a control input receiving a periodic signal which is suitable for connecting the output of the multiplexer to the input conveying the k information bits while these k bits are passing, and to the output of the other exclusive OR circuit during the gap set aside for inserting the check bit, the output of the multiplexer feeding firstly the first shift register and secondly a synchronizing bistable whose output constitutes the output of the Wyner-Ash serial encoder.

The invention also provides a serial decoder suitable for use in a digital transmission installation fitted with the above-specified encoder, the error correcting decoder comprising m shift registers in series, with the first k of the shift registers each comprising n bistables, and with the last shift register including at least n bistables with the inputs to the last k thereof each being connected to the output of the preceding bistable via a respective exclusive OR circuit also having a corresponding external input, and with the last bistable being the output bistable from the decoder, the outputs from the shift registers being connected to m respective exclusive OR circuits in exactly the same manner as the outputs of the shift registers in the encoder, and the m outputs from these exclusive OR circuit being connected in the same manner to another exclusive OR circuit, with the output therefrom being connected via a gate which is opened by the above-mentioned periodic signal to an exclusive OR circuit having two inputs, with the other input of the exclusive OR circuit receiving the received stream of digital signals that is applied to the decoder, and with its output being connected firstly to the input of the first shift register and secondly to a binary-to-decimal converter which also has the outputs of the $p-1$ first shift registers connected thereto and which is enabled by the output signal from the p-th shift register via an AND gate which also receives at least said periodic signal, the k first outputs of the binary-to-decimal converter (one of which specifies the position of the error) being connected to respective ones of the above-mentioned external inputs to the exclusive OR circuits preceding each of the k last bistables of the last shift register in such a manner as to correct the error momentarily stored in the register, with the enable signal for the binary-to-decimal converter being used simultaneously to reset to zero the first bistable of each of the p first shift registers so as to clear the syndrome bits they contain and which together specify the position of the error which is simultaneously corrected.

BRIEF DESCRIPTION OF THE DRAWINGS

An embodiment of the invention is described by way of example with reference to the accompanying drawings, in which.

DETAILED DESCRIPTION

Figure 2:
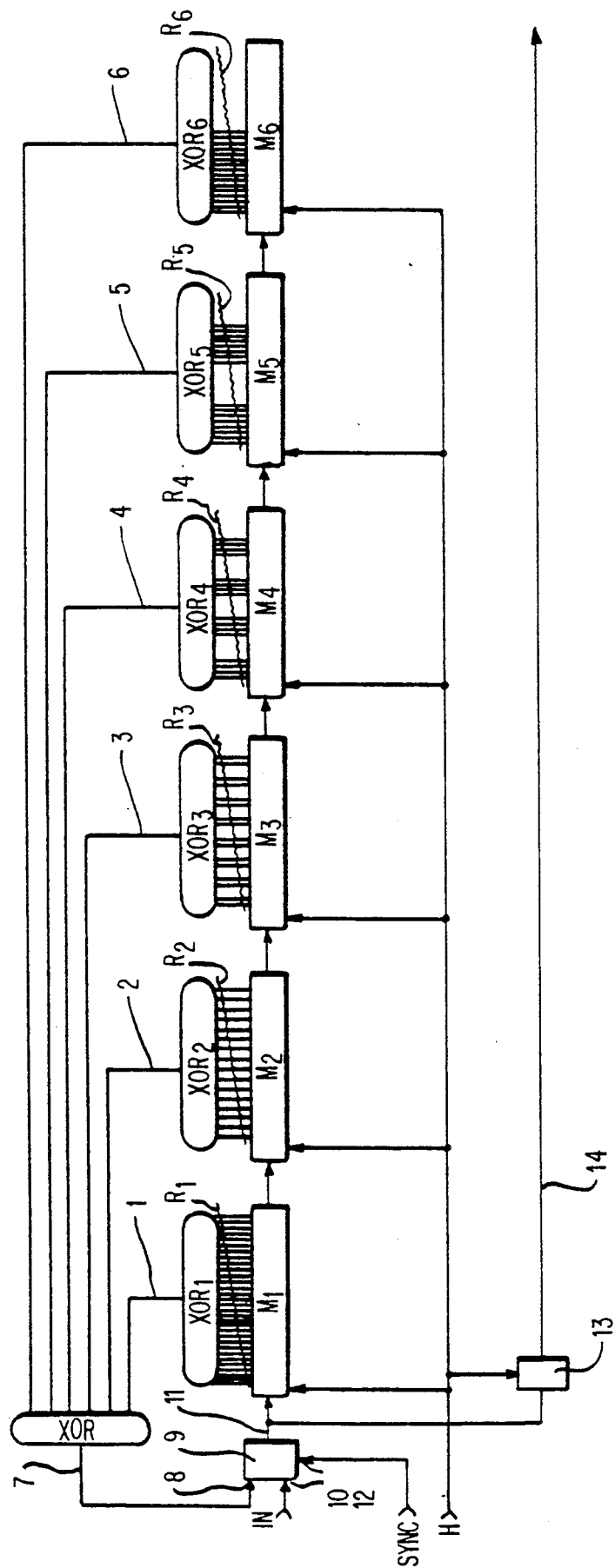
FIG. 2 is a diagram of the encoder of the invention.

With reference initially to FIG. 2, the serial encoder is applicable to the Wyner-Ash code for which the above-mentioned integer p is equal to 5, thereby giving the code a redundancy rate of 3.2%. The three parameters for the code are thus as follows:

$$k = 2p - 1 = 31$$

$$n = k + 1 = 32$$

$$m = p + 1 = 6$$

Its generator matrix is constituted by the following six rows R1 to R6:

R1: 1111111111111111111111111111111
i.e. 31 times the coefficient "1"
R2: 1010101010101010101010101010101
i.e. alternating single "1s" and "0s"
R3: 1100110011001100110011001100110
i.e. sequences of two "1s" followed by two "0s"
R4: 1111000011110000111100001111100
i.e. sequences of four "1s" followed by four "0s"
R5: 1111111100000000111111110000000
i.e. sequences of eight "1s" followed by eight "0s"
R6: 1111111111111111000000000000000
i.e. a sequence of sixteen "1s" followed by fifteen "0s".

The serial encoder includes six shift registers connected in series and referenced M1 to M6 in FIG. 2. Each of these registers has n bistables, i.e. 32 bistables in the present case.

The outputs from the 31 first bistables of the first register M1 are weighted by respective coefficients defined by the first row R1 of the generator matrix, and are thus all connected to a first exclusive OR circuit XOR1.

Similarly, the 31 first outputs from the second register M2 are connected to a second exclusive OR circuit XOR2 when they correspond to a "1" value coefficient in the line R2, and they are not connected when they correspond to a "0" value coefficient in the line R2, such that every other output is, in fact, connected to XOR2.

By continuing in the same manner to the last register M6, it can be seen that those ones of the 31 first outputs of the following registers M3 to M6 which are connected to a respective exclusive OR circuit XOR3 to XOR6, are defined by the distribution of "1" value coefficients in the respective rows R3 to R6 of the matrix. This is connection by groups of two outputs followed by gaps of two non-connected outputs, then by groups of four outputs separated by gaps of four outputs, then by groups of eight outputs separated by gaps of eight outputs, and finally a single block of sixteen outputs (in this context, it should be observed that the last shift register M6 may be a 16 bistable register since no use is made of the following 16 bistables).

The six outputs 1 to 6 respectively from the six exclusive OR circuits XOR1 to XOR6 are each connected to a further exclusive OR circuit XOR whose output 7 is applied to the input 8 of a two-input multiplexer 9 having inputs 8 and 10 and an output 11, together with a control input 12 suitable for causing the output 11 to be connected either to the input 10 or else to the input 8 depending on the respective value "0" or "1" of a signal "sync" which is applied thereto.

The input 10 receives the information data IN which is constituted by sequences of 31 information bits separated from each other by single spaces prepared upstream in a buffer memory block and suitable for receiving an extra bit for check purposes.

The signal sync is equal to 0 while the 31 above-mentioned information bits pass through, and it switches to 1 during the above-mentioned gap, thereby inserting the extra check bit.

The output 11 from the input multiplexer 9 is connected firstly to the input of the first shift register M1, and secondly to a synchronizing D type bistable 13 whose output 14 constitutes the output of the encoder.

Naturally, all six registers in cascade M1 to M6 and the bistable 13 are synchronized by the clock signal H for the information stream IN.

The encoder operates as follows: when switched on, all six registers M1 to M6 are initialized to zero. This initialization helps explain how the encoder operates, and does not reoccur since the encoding becomes valid only after the first 192 bits have passed through, as described below.

Initialization is assumed to be terminated when the signal sync is activated to "1" (with the duration of a sync pulse being equal to one period of the clock H). The beginning of the message to be encoded then corresponds to the falling edge in said pulse sync, whose return to level "0" then activates reception of data into the register M1 via the input multiplexer 9.

After passing a first sequence of 31 bits, the signal sync returns to "1" for one clock period: the output 11 of the multiplexer 9 is then connected to the input 8, i.e. to the output 7 of the circuit XOR. Since the circuits XOR2 to XOR6 have their outputs at zero, it follows that the signal which is inserted on the 32nd clock pulse into the first bistable of the register M1 is the modulo-2 sum of the 32 first information bits previously entered into the register. This signal thus provides the check bit.

The process is repeated until all six registers M1 to M6 are completely filled, and this occurs after 192 clock pulses have elapsed since initialization.

Figure 1:
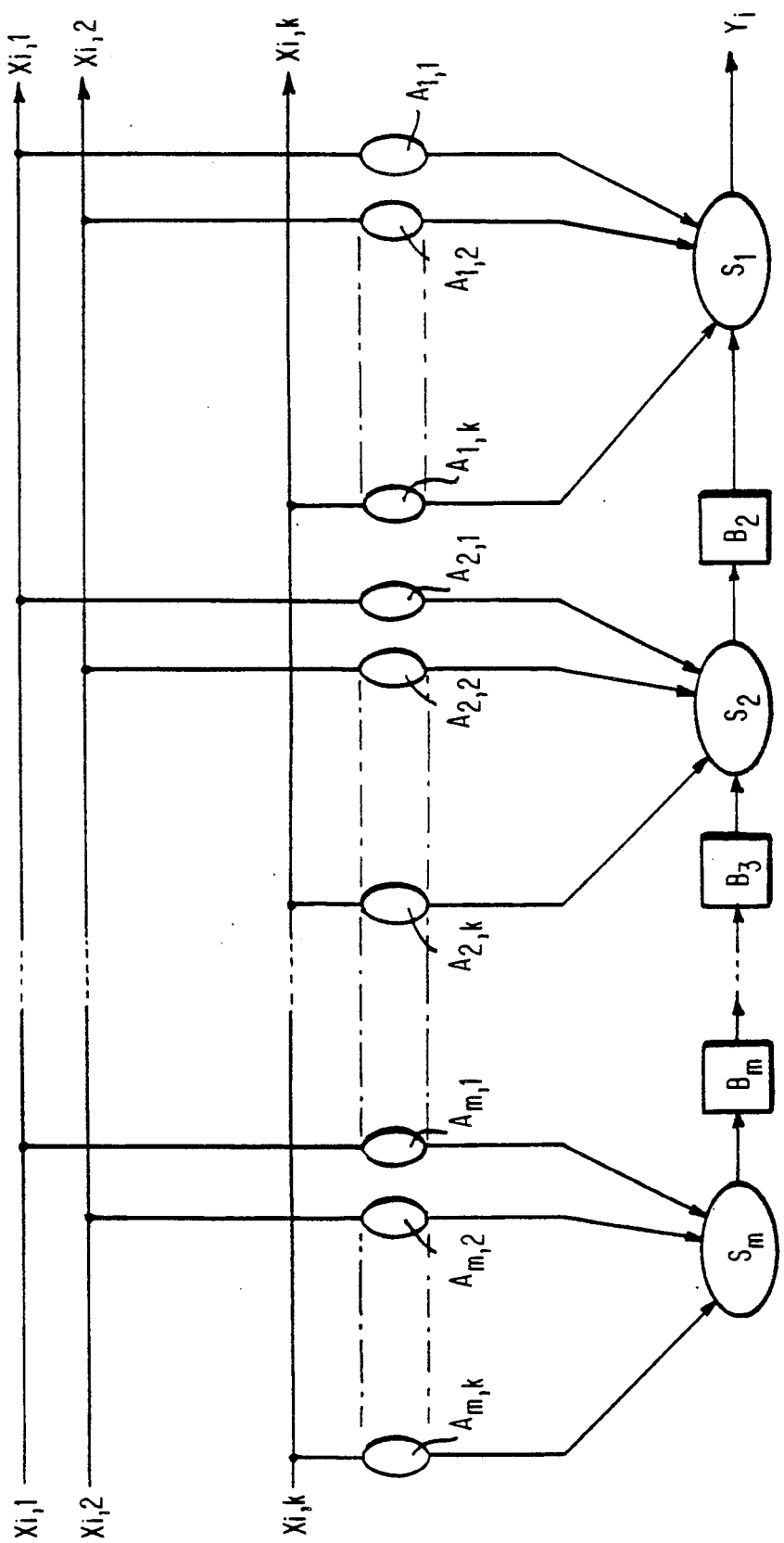
FIG. 1 is a diagram for explaining Wyner-Ash encoding.

It is only at this moment that the Wyner-Ash encoding becomes operational since the check bits inserted every 31 bits along the message being output from the bistable 13 now start being calculated in accordance with the encoding matrix (as implemented by the connections R1 to R5), and in accordance with the diagram of FIG. 1 as described above. Finally, this is indeed an encoder in which a stream enters at 10 and leaves serially at 14, but in which encoding is performed in parallel by virtue of the six memories M1 to M6 and their associated circuits.

After the first 192 clock pulses have elapsed, the encoding delay is one clock pulse only, which delay is due to the synchronizing bistable 13.

Figure 3:
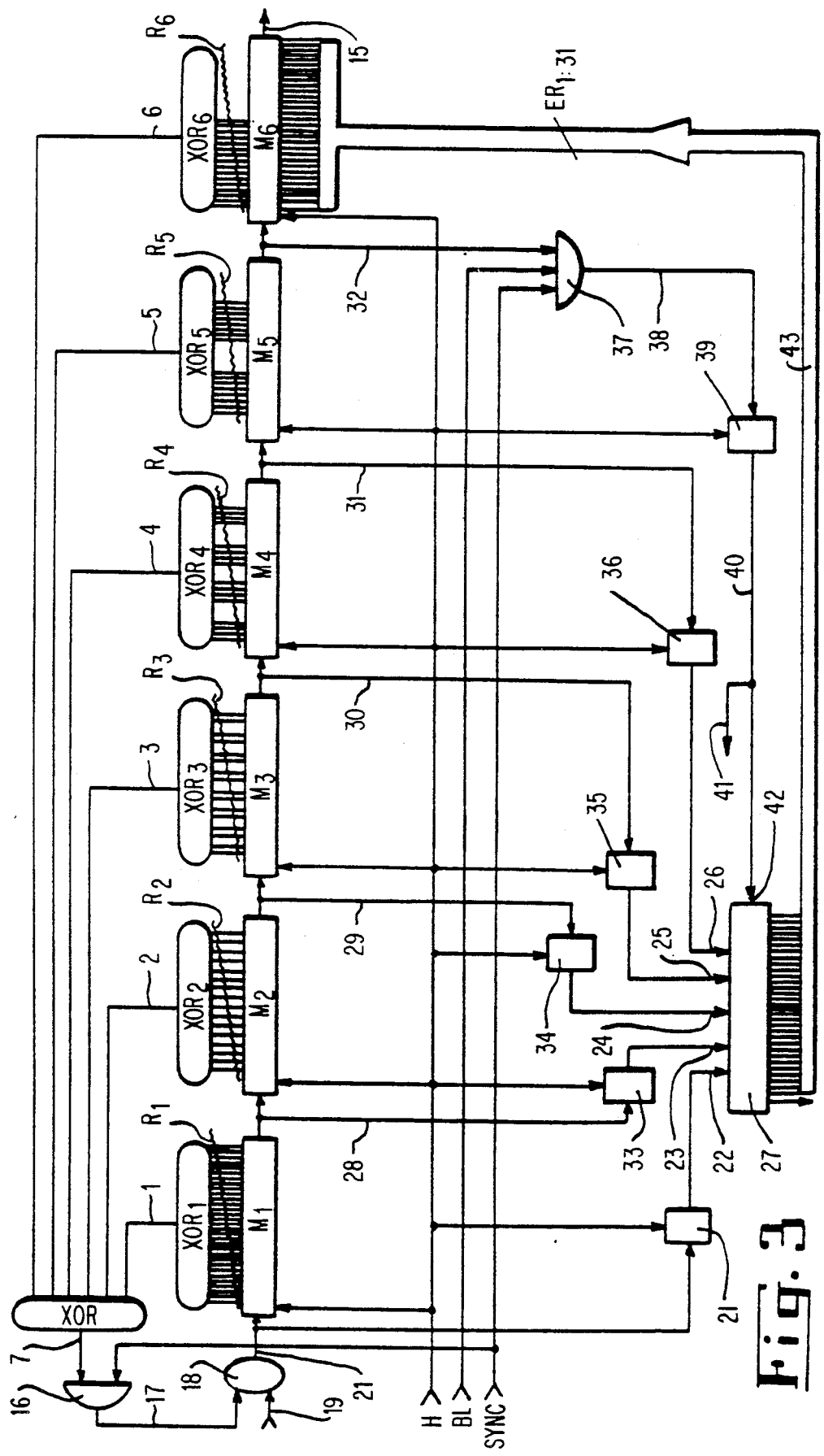
FIG. 3 is a diagram of the decoder of the invention.
Figure 4:
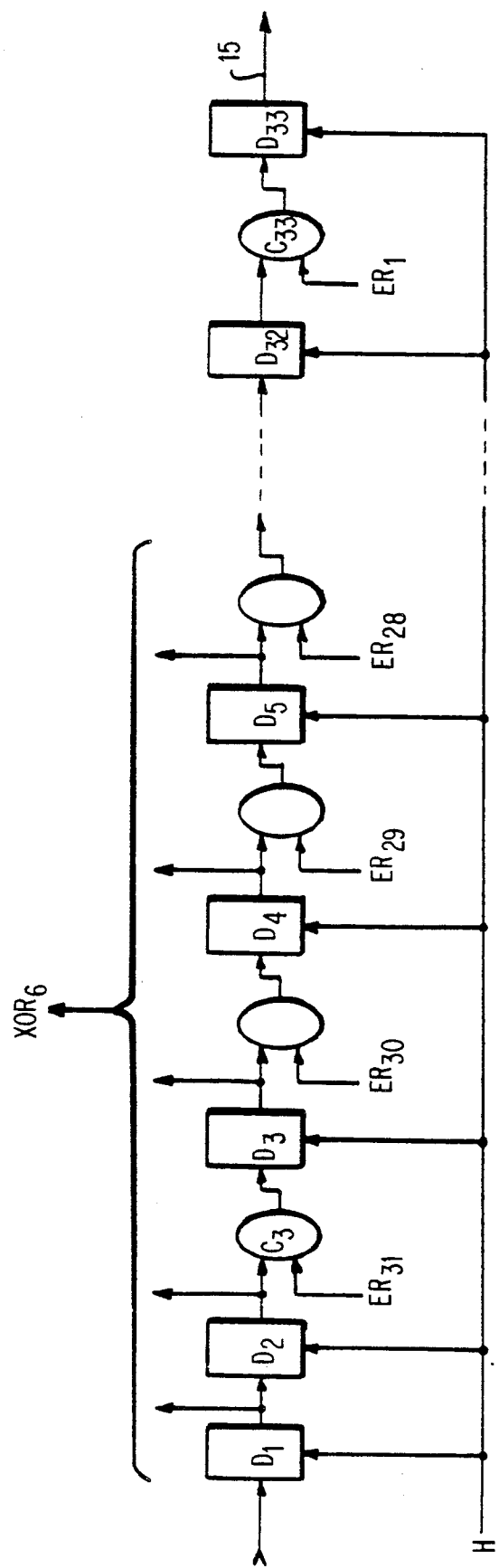
FIG. 4 is a diagram of the last shift register fitted to the decoder.

With reference to FIGS. 3 and 4 which constitute the circuit diagram for the serial decoder which is associated at the receive end with the send encoder of FIG. 2, it can clearly be seen that the decoder is, in part, very similar to the encoder of FIG. 2, in particular with respect to having six shift registers M1 to M5 and M'6 connected in series, and in which:

the first five registers M1 to M5 are identical to the registers M1 to M5 of the encoder, and are connected in the same way to exclusive OR circuits XOR1 to XOR5, which are in turn connected in the same way to another exclusive OR circuit, XOR; and the last register M'6 is special and is shown in detail in FIG. 4: it does indeed have its first sixteen outputs connected to the circuit XOR6 which is in turn connected to XOR, however it includes 33 bistables D1 to D33, with the inputs of the last 31 of them (D3 to D33) each being connected to the output of the preceding bistable (D2 to D32) via a respective exclusive OR gate C3 to C33, each of which OR gates has a respective external input ER31 to ER1 which may represent the address of an erroneous bit to be corrected, as explained below; the output 15 of the last bistable constitutes the output from the decoder and naturally all of the bistables in the registers M1 to M'6 receive the above-mentioned clock signal H.

The output 7 from the circuit XOR is connected to an AND gate 16 whose other input receives the above-mentioned signal sync and whose output 17 is connected to a first input of an exclusive OR circuit 18 whose other input 19 receives the digital information stream to be decoded: terminal 19 thus constitutes the input to the decoder.

The output 20 from the circuit 18 is connected firstly to the input of the first shift register M1, and secondly via a D type bistable 21 which also receives the clock signal H to the first of the five inputs 22 to 26 of a binary-to-decimal converter 27. The outputs 28 to 31 of the registers M1 to M4 (or in other words the inputs to the registers M2 to M5) are respectively connected to the inputs 23 to 26 of this binary-to-decimal converter 27, via respective D type bistables 33 to 36 which are also synchronized by the clock signal H.

The 31 last outputs ER31 to ER1 of the converter 27 are connected to the above-mentioned external inputs to the exclusive OR circuit C3 to C33 (see FIG. 4) included in the register M'6.

The output 32 of the register M5 feeds a gate 37 which also receives the above-mentioned signal sync together with an optional external signal B1 for switching off error correction. The output 38 from the gate 37 is applied to a D type bistable 39 which is likewise synchronized by the clock H. The output 40 from the bistable 39 provides firstly an enable signal at 42 to the binary to decimal converter 27, and secondly a reset to zero signal at 41 to the first bistable of each of the registers M1 to M5.

This Wyner-Ash serial decoder operates as follows:

On receiving the 31 first data bits received at input 19, the signal sync is at level "0" such that the gate 16 is closed and the signals present at 19 are transmitted from 20 to the first shift register M1, thereby filling its first 31 bistables.

When the 32nd bit arrives, it is known to be a check bit. The signal sync therefore switches to level "1", thereby opening the gate 16. Consequently another check bit calculated by the circuit XOR1 is applied at 17 to the exclusive OR gate 18 at the same time as the received check bit which is applied at 19. A so-called "syndrome" bit therefore appears at 20, which bit is equal to zero if the received check bit is identical in level to the recalculated check bit, and which is otherwise equal to one. In other words, a syndrome bit equal to one indicates that there is an error in the received message. The syndrome bit is then written into the first bistable of the register M1. Assume that it is equal to zero and allow all of the registers including register M6 to fill up in the same manner with respective blocks of 31 information bits preceded by respective syndrome bits. The decoder is then ready to operate.

It is now assumed that an error appears in the first following sequence of 32 bits received at the input of the register M1. When this sequence has filled the register M1, an error is detected since the calculated bit at the output of XOR is necessarily different from the received check bit: the syndrome bit applied to the first bistable of M1 is thus equal to 1.

This erroneous sequence then fills the block M2. The syndrome bit which is then calculated will be equal to 1 if the error is to be found on one of the wires connected to XOR2, and otherwise it will be equal to zero, and so on up to the register M5. It will immediately be seen that given the way the 1 and 0 coefficients are distributed over the rows R1 to R5 of the matrix, these five calculated bits correspond to a binary code specifying the position of the error: for example if the error is in the 9th position of the sequence of 31 information bits, then the positions of the syndrome bits will be as follows:

0 1 0 0 1 which does indeed correspond to the binary representation of the number 9.

When the 31 bits of the erroneous sequence are input into the register M'6, the syndrome bit (equal to 1) of this sequence is applied simultaneously to the first bistable D1 of the register M'6 and to the AND gate 37 which is then opened by virtue of the fact that the signal sync is also in the 1 state and the signal 1 is not in the 0 state (which would represent an external instruction to switch off error correction).

The level 1 which emerges at 38 is thus recorded in D type bistable 39 as are the five syndrome bits present at 20, 28, 29, 30, and 31 which are recorded in respective D type bistables 21, 33, 34, 35, and 36, with these five syndrome bits being the binary representation of the position of the error in the sequence now recorded in the block M'6.

At the next clock pulse, the binary to decimal decoder 27 is enabled by the output 40 from the D type bistable 39, while the outputs 22 to 26 of the five other D type bistables are applied thereto. The last 31 output wires from the circuit 27 are respectively connected via a bus 43 to the inputs ER1 to ER31 of the adder circuits C33 to C3 (FIG. 4), such that the activated output of the circuit 27 which represents the decimal position of the error serves to correct the error in the bistable of the register M'6 containing it by acting on the corresponding exclusive OR circuit.

It should be observed, as can be seen in FIG. 3, that the lefthand output wire from the circuit 27 is unconnected since it corresponds to an error on the check bit and such an error is naturally not corrected since it is meaningless on output from the decoder.

Simultaneously, the first bistables in the registers M1 to M5 are reset to zero by the level 1 which appears on the wire 41, thereby clearing the five syndrome bits so as to prevent these syndrome bits giving rise to unwanted corrections: the syndrome bits must be cleared after they have indicated the position of the error so as to avoid giving rise to further error corrections that are not justified.

The corrected sequence finally leaves at 15 with a decoding delay equal to 193 clock pulses. Naturally, this operation is made possible by the fact that, by definition, the code is capable of correcting only one error over the entire constraint length of 192 bits.

The process then repeats, and continues indefinitely with the possibility of correcting one error in each 192-bit long constraint length.

It should be observed that the encoder and the decoder are relatively similar in structure. Consequently, a Wyner-Ash encoder-decoder block capable of performing both functions may be provided in a prediffused AISC type circuit. Such a module can thus easily be adapted to frames using the following types of modulation: QPSK, 16QAM, 64QAM, and 256QAM, by processing each stream independently.

Naturally the invention is not limited to the embodiment described above. Thus, the bistables 21, 33 to 36, 39, and D33 which serve to enable the entire calculation to be performed in two clock pulses instead of one while also synchronizing the signal, could be omitted under other technological conditions, and as a result the register M'6 could consequently be shortened.

We claim:

1. An error correcting encoder/decoder system for a digital transmission installation, the system using a Wyner-Ash error correcting code whose delay memory order m is greater than or equal to 6, with parameters k and n of the code being as follows:

$k\{\text{number of input information bits}\} = 2^p - 1$ $n\{\text{number of output bits}\} = k + 1$ where $m = p + 1$, where p is an integer, wherein the system includes an encoder comprising: m shift registers connected in series, with at least a first p of the shift registers each including n bistables, the outputs from a first k of the bistables of a first of the p shift registers being connected to a first exclusive OR circuit, the outputs of the first k of the bistables of a second through (m−1)-th of the p shift registers being connected to a second through (m−1)-th exclusive OR circuit corresponding thereto if the outputs correspond to a one value coefficient of a corresponding row of a code generator matrix of the Wyner-Ash error correcting code, and being unconnected when they correspond to a zero value coefficient, and the m-th shift register being associated with an m-th exclusive OR circuit, m outputs of the respective m exclusive OR circuits being connected to another exclusive OR circuit whose output is applied to a first input of an input multiplexer to the encoder, a second input of the input multiplexer receiving successive sequences each constituted by k information bits to be encoded, followed by a gap suitable for receiving a check bit, the input multiplexer having a control input receiving a periodic signal which operates to connect the output of the input multiplexer to the second input conveying the k information bits while the k bits are passing, and operates to correct the first input conveying the output of the another exclusive OR circuit during the gap set aside for inserting the check bit, said output of the input multiplexer feeding firstly the first shift register and secondly a synchronizing bistable whose output constitutes the output of the encoder.

2. An error correcting encoder/decoder system according to claim 1, wherein the system further includes an error correcting decoder comprising: m shift registers connected in series, with a first p of the shift registers each comprising n bistables, and the m-th shift register including at least n bistables with the inputs to a lack k thereof each being respectively connected to the output of the preceding bistable within the m-th shift register via a respective exclusive OR circuit also having a corresponding external input, and with an output of the last bistable of the m-th shift register being output from the decoder, outputs from the shift registers being connected to m respective exclusive OR circuits, and the m outputs from the m respective exclusive OR circuits being connected to another exclusive OR circuit, with the output therefrom being connected via a gate which is opened by the periodic signal to a first input of an input exclusive OR circuit, a second input of the input exclusive OR circuit receiving a received stream of digital signals that are applied to the decoder, and with the output of the input exclusive OR circuit being connected firstly to the input of the first shift register and secondly to a binary-to-decimal converter which also receives the outputs of the first $p-1$ of the shift registers connected thereto and which is enabled by an enable signal output from the p-th shift register via an enable gate which also receives at least the periodic signal, a first k of the outputs of the binary-to-decimal converter being connected to respective ones of the external inputs via the exclusive OR circuits preceding each of a last k bistables of the m-th shift register to correct an error momentarily stored in the m-th shift register, with the enable signal for the binary-to-decimal converter being used simultaneously to reset to zero the first bistable of each of the first p shift registers so as to clear syndrome bits which specify a position of the error which is simultaneously corrected.

3. An error correcting encoder/decoder system according to claim 2, wherein the enable gate also receives an external signal for switching off error correction.

4. An error correcting encoder/decoder system according to claim 2, wherein the enable signal from the enable gate and error address specifying signals are applied to the binary-to-decimal converter via respective D-type bistables.

5. An encoder for a digital transmission installation, said encoder using a Wyner-Ash error correcting code whose delay memory order m is greater than or equal to 6, with parameters k and n of the code being as follows:

$k\{number\ of\ input\ information\ bits\} = 2^p - 1$ $n\{number\ of\ output\ bits\} = k + 1$ where $m = p + 1$, where p is an integer, said encoder comprising:
first through m-th exclusive OR circuits;
first through m-th shift registers connected in series, with at least a first p of the shift registers each including n bistables, the outputs from a first k of the bistables of the first shift register being connected to the first exclusive OR circuit, the outputs of a first k of the bistables of the second through $(m-1)$-th shift registers being respectively connected to the second through $(m-1)$-th exclusive OR circuits if the outputs of the first k of the bistables of the respective shift registers correspond to a one value coefficient of a respective row of a code generator matrix of the Wyner-Ash error correcting code, and being unconnected when they correspond to a zero value coefficient, the m-th shift register being associated with the m-th exclusive OR circuit;
a check bit exclusive OR circuit for receiving the m outputs of each of the first through m-th exclusive OR circuits and for producing a check bit signal;
a synchronizing bistable whose output constitutes the output of the encoder; and
an input multiplexer for receiving the check bit signal at a first input of the input multiplexer and receiving successive sequences of k information bits to be encoded at a second input of the input multiplexer, followed by a gap suitable for receiving a check bit, the input multiplexer further having a control input receiving a periodic signal which operates to output the second input from the input multiplexer to output the k information bits, and operates to output the first input conveying the output of the check bit exclusive OR circuit during the gap set aside for inserting the check bit, said output of the input multiplexer feeding the first shift register and the synchronizing bistable.

6. A decoder for decoding a digital transmission encoded using a Wyner-Ash correcting code whose delay memory order m is greater than or equal to 6, with parameters k and n of the code being as follows:

$k\ \{number\ of\ input\ information\ bits\} = 2^p - 1$ $n\{number\ of\ output\ bits\} = k + 1$ where $m = p + 1$, where p is an integer, said decoder comprising:
first through m-th exclusive OR circuits;
first through m-th shift registers connected in series, with a first p of the shift registers each comprising n bistables, and the m-th shift register including at least n bistables with the inputs to a last k thereof each being respectively connected to the output of the preceding bistable within the m-th shift register via a respective error correction exclusive OR circuit also having a corresponding external input, and with the output of the last bistable of the m-th shift register being the output from the decoder, the outputs from the shift registers being respectively connected to said first through m-th exclusive OR circuits, the outputs from a first k of the bistables of the first shift register being connected to the first exclusive OR circuit, the outputs of a first k of the bistables of the second through $(m-1)$-th shift registers being respectively connected to the second through $(m-1)$-th exclusive OR circuits if the outputs of the first k of the bistables of the respective shift registers correspond to a one value coefficient of a respective row of a code generator matrix of the Wyner-Ash error correcting code, and being unconnected when they correspond to a zero value coefficient;
check bit determining means for receiving the m outputs from the first through m-th exclusive OR circuits and for producing a check bit signal in accordance with a periodic signal which indicates a check bit position in the digital transmission;

input means for receiving the check bit signal and a stream of digital signals that are applied to said decoder, and for outputting via an output terminal one of the stream of digital signals and the check bit signal as an input signal, the output terminal being connected to the input of the first shift register; and a binary-to-decimal converter means, operatively connected to the output terminal of said input means, for receiving the input signal and for receiving the outputs of the first p−1 of the shift registers, said binary-to-decimal converter means having at least k output bits, the first k of the output bits of said binary-to-decimal converter being connected to respective ones of the external inputs via the error correction exclusive OR circuits preceding each of the last k bistables of the m-th shift register to correct an error momentarily stored in the m-th shift register.

* * * * *